(12) United States Patent
Kurosawa et al.

(10) Patent No.: US 7,211,875 B2
(45) Date of Patent: May 1, 2007

(54) VOLTAGE-CONTROLLED CAPACITIVE ELEMENT AND SEMICONDUCTOR INTEGRATED CIRCUIT

(75) Inventors: Susumu Kurosawa, Kanagawa (JP); Yuki Fujimoto, Kanagawa (JP); Yasutaka Nakashiba, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/819,123

(22) Filed: Apr. 7, 2004

(65) Prior Publication Data

US 2004/0201045 A1 Oct. 14, 2004

(30) Foreign Application Priority Data

Apr. 8, 2003 (JP) ............................. 2003-103917

(51) Int. Cl.
*H01L 29/66* (2006.01)
(52) U.S. Cl. ........................................ 257/532; 257/313
(58) Field of Classification Search ................ 257/313, 257/532
See application file for complete search history.

(56) References Cited

U.S. PATENT DOCUMENTS

| | | | |
|---|---|---|---|
| 4,633,097 A | * 12/1986 | Dewitt | ........................ 327/20 |
| 5,696,452 A | * 12/1997 | Hemmenway et al. | ...... 324/760 |
| 5,883,423 A | * 3/1999 | Patwa et al. | ................. 257/532 |
| 6,040,610 A | * 3/2000 | Noguchi et al. | ............ 257/392 |
| 6,400,001 B1 | * 6/2002 | Manzini et al. | ............. 257/601 |
| 2002/0140109 A1 | 10/2002 | Keshavarzi et al. | |

FOREIGN PATENT DOCUMENTS

| | | |
|---|---|---|
| JP | 59-104180 A | 6/1984 |
| JP | 4-37070 A | 2/1992 |
| JP | 2951128 B2 | 7/1999 |
| JP | 2001-516955 A | 10/2001 |

* cited by examiner

*Primary Examiner*—Thomas L. Dickey
(74) *Attorney, Agent, or Firm*—Sughrue Mion, PLLC

(57) ABSTRACT

An N well is disposed in the upper surface of a P type substrate, a gate insulating film and a gate electrode are disposed thereon, and the gate electrode is connected to a gate terminal. Two $p^+$ diffusion regions are placed in two areas in the surface of the N well sandwiching the gate electrode, and the $p^+$ diffusion regions are connected to a ground potential wiring. Further, an $n^+$ diffusion region is disposed in the surface of the N well, and is connected to a well terminal. Accordingly, capacitance is generated between the gate electrode and the N well of a varactor element. When the potential of the gate terminal is decreased, the two $p^+$ diffusion regions absorb positive holes serving as minority carriers from a channel region.

7 Claims, 7 Drawing Sheets

VOLTAGE-CONTROLLED CAPACITIVE ELEMENT AND SEMICONDUCTOR INTEGRATED CIRCUIT

BACKGROUND OF THE INVENTION

1. Field of the Invention

The present invention relates to a voltage-controlled capacitive element, in which the capacitance can be controlled by an applied voltage, and a semiconductor integrated circuit (IC) including the same. In particular, the present invention relates to a voltage-controlled capacitive element preferably incorporated into an oscillation circuit (hereinafter referred to as a voltage-controlled oscillator (VCO)), which is used for an electronic apparatus or the like and whose oscillation frequency can be controlled by an applied voltage.

2. Description of the Related Art

MOS (metal oxide semiconductor) type varactor elements have been used as voltage-controlled capacitive elements in semiconductor ICs (for example, see Japanese Patent No. 2951128). A MOS type varactor element is used, for example, for controlling an oscillation frequency of an LC-VCO.

FIG. 1 is a cross-sectional view showing a conventional MOS type varactor element. As shown in FIG. 1, in the varactor element 101, an N well NW101 is disposed in the upper surface of a P type substrate PSub. A gate insulating film 102 is disposed on the N well NW101, and a gate electrode 103, which is formed of poly silicon (polycrystalline silicon) for example, or the like is disposed on the gate insulating film 102. Also, $n^+$ diffusion regions N101 and N102 are placed in two areas in the surface of the N well NW101 sandwiching the gate electrode 103 viewed in the direction vertical to the upper surface of the P type substrate PSub. In the surface of the N well NW101, the region between the $n^+$ diffusion regions N101 and N102 serves as a channel region 104. Further, a $p^+$ diffusion region P101 is placed, in the upper surface of the P type substrate PSub, in part of an area where the N well NW101 is not disposed.

The $n^+$ diffusion regions N101 and N102 are connected to a well terminal Vb, the gate electrode 103 is connected to a gate terminal Vg, and the $p^+$ diffusion region P101 is connected to a ground potential wiring GND. In FIG. 1, the gate insulating film 102 is disposed only directly under the gate electrode 103, but the gate insulating film 102 may be disposed over the entire upper surface of the P type substrate PSub except an area which contacts (not shown) connected to diffusion regions are disposed. In this varactor element 101, capacitance is generated between the gate electrode 103 and the N well NW101.

In the conventional varactor element 101, a ground potential is applied to the $p^+$ diffusion region P101 through the ground potential wiring GND, so that the P type substrate PSub is at the ground potential. Also, by changing a voltage applied between the gate terminal Vg and the well terminal Vb (hereinafter referred to as voltage between terminals Vgb (=Vg−Vb), the capacitance between the gate electrode 103 and the N well NW101 can be changed. FIG. 2 is a graph showing the voltage dependence of the capacitance in the varactor element 101, in which the horizontal axis indicates the voltage between terminals (Vgb) and the vertical axis indicates the capacitance between the gate terminal Vg and the well terminal Vb.

As shown in FIGS. 1 and 2, by setting the voltage between terminals Vgb at an adequately high value $V_2$, electrons accumulate in the channel region 104 of the N well NW101, so that the varactor element 101 is brought into an accumulation state. As a result, the capacitance of the varactor element 101 reaches a maximum, which is substantially equal to the capacitance of the gate insulating film 102. By decreasing the voltage between terminals Vgb from this state, a depletion layer is generated in the channel region 104 of the N well NW101. As the depletion layer expands, the capacitance of the varactor element 101 decreases along a solid line 53. Then, when the voltage between terminals Vgb reaches an adequately low value $V_1$, expansion of the depletion layer becomes saturated. Accordingly, the capacitance reaches a minimum and does not decrease any more.

However, the above-described prior art has the following problems. By decreasing the voltage between terminals from $V_2$ to $V_1$, the capacitance of the varactor element 101 decreases along the solid line 53, as indicated by an arrow 51. At this time, if the voltage between terminals is instantly changed, the capacitance is also changed instantly. After that, however, even if the voltage between terminals is kept constant at $V_1$, the capacitance gradually increases as indicated by an arrow 52. That is, the capacitance increases by several % to about 10% over several seconds to several minutes, and finally reaches a thermal equilibrium state as indicated by a broken line 54. In this way, even if the voltage between terminals is instantly changed, time is required until the capacitance reaches the thermal equilibrium state indicated by the broken line 54. That is, the capacitance does not quickly follow change in the voltage between terminals. Therefore, when this varactor element is incorporated into a VCO, change in the oscillation frequency thereof is delayed to change in the control voltage, that is, the oscillation frequency does not quickly follow change in the control voltage.

SUMMARY OF THE INVENTION

An object of the present invention is to provide a voltage-controlled capacitive element in which capacitance quickly changes in response to change in a voltage between terminals, and a semiconductor integrated circuit including the same.

A voltage-controlled capacitive element according to the present invention includes a substrate; a first conductivity region which is disposed in the surface of the substrate and which is applied a first potential; a second conductivity region which is disposed in part of the surface of the first conductivity region and which is applied a second potential which does not generate a forward pn junction between the first conductivity region and the second conductivity region; an insulating film disposed on the first conductivity region and the second conductivity region; and a conductive film which is disposed on the insulating film, where the insulating film is on an area which is at least of a part of a surface area of the first conductivity region, but is not on an area directly over the second conductivity region. And a third potential is applied to the conductive film. And capacitance is generated by the first conductivity region, the insulating film, and the conductive film.

In the present invention, the third potential to the first potential is changed so as to shift the voltage-controlled capacitive element from an accumulation state to a depletion state. That is, first conductivity carriers accumulated directly under the conductive film in the first conductivity region are flown out so that a depletion layer is generated therein. At this time, the second conductivity region absorbs the second conductivity carriers, and thus the second conductivity carriers do not accumulate and an inversion layer is not generated. Accordingly, the capacitance does not change gradually after the depletion layer is generated directly under the conductive film, and thus the capacitance changes more quickly in response to change in the voltage between terminals.

Preferably, the second conductivity region may include first and second portions which are connected each other and which are positioned so as to sandwich the conductive film viewed in the direction vertical to the surface of the substrate. With this configuration, the voltage-controlled capacitive element of the present invention can be made so as to have a configuration similar to that of a MOS transistor. As a result, an equivalent circuit used for simulating the operation of the voltage-controlled capacitive element of the present invention can be formed by using parameters of the existing MOS transistor.

Preferably, a region between the first and second portions in the first conductivity region may be rectangular viewed in the direction vertical to the surface of the substrate, and the length of the rectangular region in the direction from the first portion to the second portion may be shorter than the length in the orthogonal direction. With this configuration, the second conductivity region can absorbs efficiently second conductivity carriers.

Further, the voltage-controller capacitive element may be provided in a semiconductor integrated circuit including a MOS transistor, and the first conductivity region, the first and second portions of the second conductivity region, the insulating film, and the conductive film may be formed in the same process as that of forming a well including a channel region, source and drain regions, a gate insulating film, and a gate electrode of the MOS transistor, respectively. Accordingly, the voltage-controlled capacitive element of the present invention can be easily fabricated in the same process as that of forming the MOS transistor.

The semiconductor integrated circuit according to the present invention includes the above-mentioned voltage-controlled capacitive element. Preferably, the semiconductor integrated circuit may include a MOS transistor, and the first conductivity region, the first and second portions of the second conductivity region, the insulating film, and the conductive film of the voltage-controlled capacitive element are formed in the same process as that of forming a well including a channel region, source and drain regions, a gate insulating film, and a gate electrode of the MOS transistor, respectively.

According to the present invention, the voltage-controlled capacitive element includes the second conductivity region for absorbing second conductivity carriers. Therefore, the capacitance does not gradually change due to generation of second conductivity carriers after a depletion layer is formed in the voltage-controlled capacitive element, and thus the capacitance quickly changes in response to change in the voltage between terminals.

DETAILED DESCRIPTION OF THE PREFERRED EMBODIMENT

Figure 2:
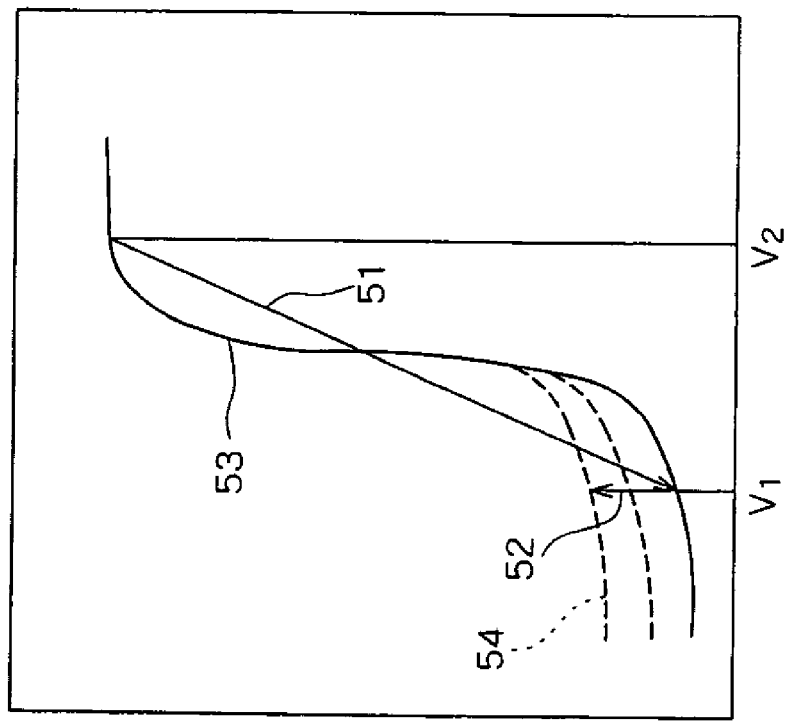
FIG. 2 is a graph showing the voltage dependence of the capacitance in the conventional varactor element, in which the horizontal axis indicates a voltage between terminals and the vertical axis indicates capacitance between a gate terminal and a well terminal.

As described above, in the conventional varactor element, even if the voltage between terminals of the varactor element 101 is decreased from $V_2$ to $V_1$ as indicated by the arrow 51 in FIG. 2, so as to decrease the capacitance of the varactor element 101 and to keep the voltage between terminals constant at $V_1$, the capacitance gradually increases as indicated by the arrow 52. The inventors have earnestly studied to solve this problem and reached the following findings.

Figure 1:
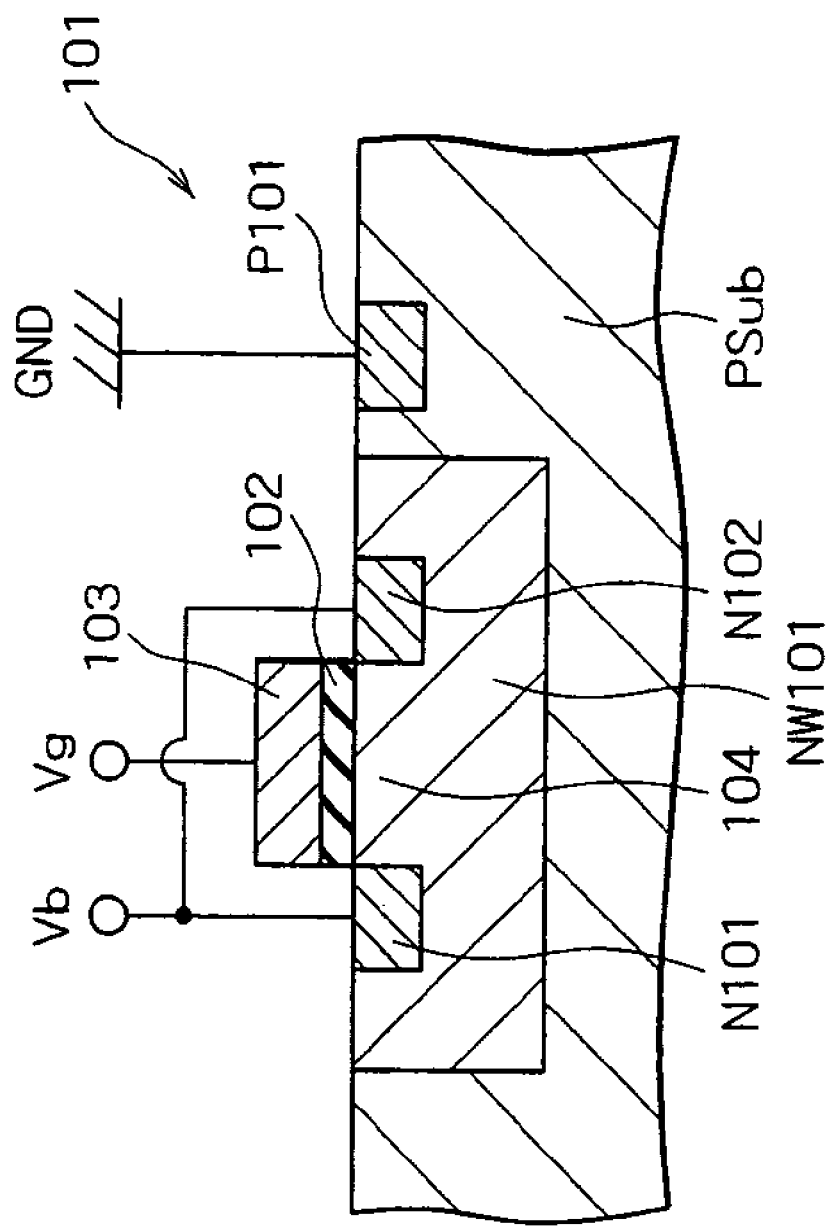
FIG. 1 is a cross-sectional view showing a conventional MOS type varactor element.

In the conventional varactor element 101 shown in FIG. 1, when the voltage between terminals is decreased from $V_2$ to $V_1$, the varactor element 101 shifts from an accumulation state to a depletion state. That is, electrons accumulated in the channel region 104 flow out and a depletion layer is generated in the channel region 104. This action corresponds to the change indicated by the arrow 51 shown in FIG. 2. Then, positive holes serving as minority carriers are generated in the channel region 104, so that an inversion layer is generated therein. Accordingly, even if the voltage between terminals is kept constant at $V_1$, the capacitance gradually increases so as to reach a thermal equilibrium state as indicated by the broken line 54. This change corresponds to the arrow 52. At this time, a source of positive holes does not exist near the channel region 104, and thus positive holes are thermally generated gradually. Therefore, an inversion layer is formed slowly, and thus the change indicated by the arrow 52 slowly proceeds over several seconds to several minutes. As a result, even if the voltage between terminals is instantly changed, the capacitance slowly reaches a thermal equilibrium state, that is, the capacitance does not change quickly.

In order to solve this problem, the inventors have found an approach of providing a second conductivity region in the varactor element. The second conductivity region absorbs positive holes serving as second conductivity carriers from the channel region. With this configuration, an inversion layer is not formed in the channel region, and thus the capacitance changes in response to change in the voltage between terminals more quickly.

Figure 3:
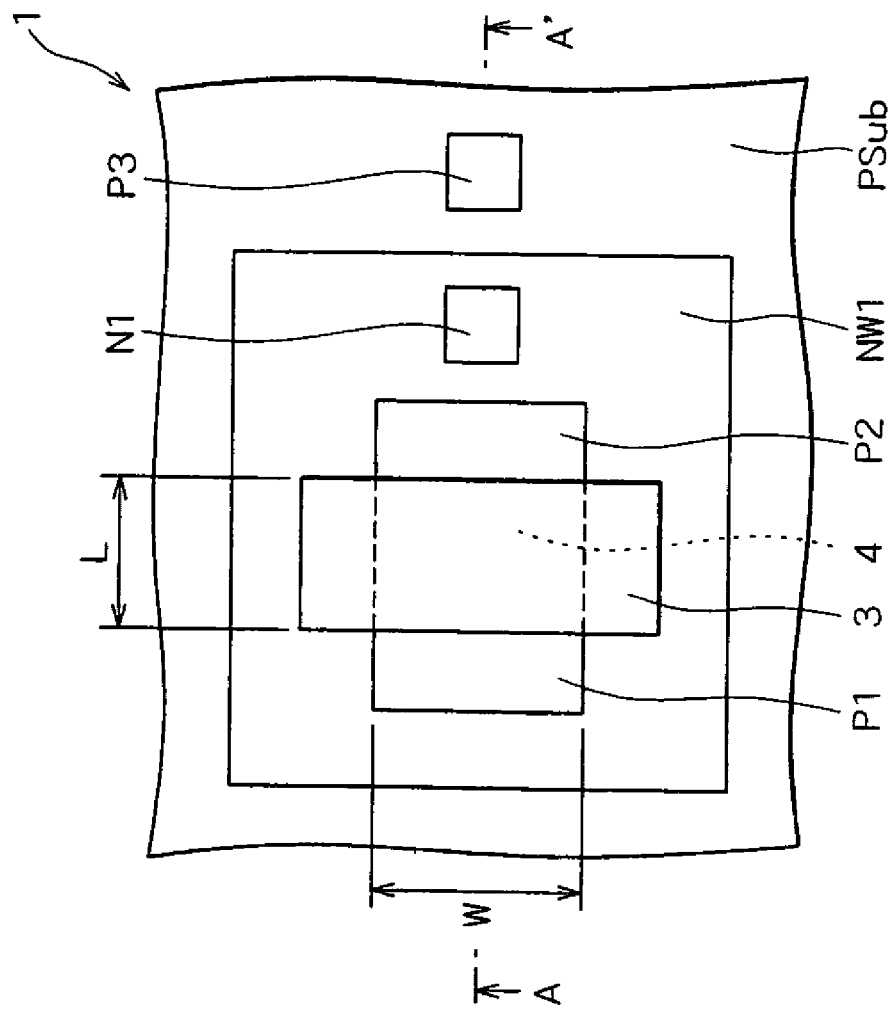
FIG. 3 is a plan view showing a varactor element according to an embodiment of the present invention.
Figure 4:
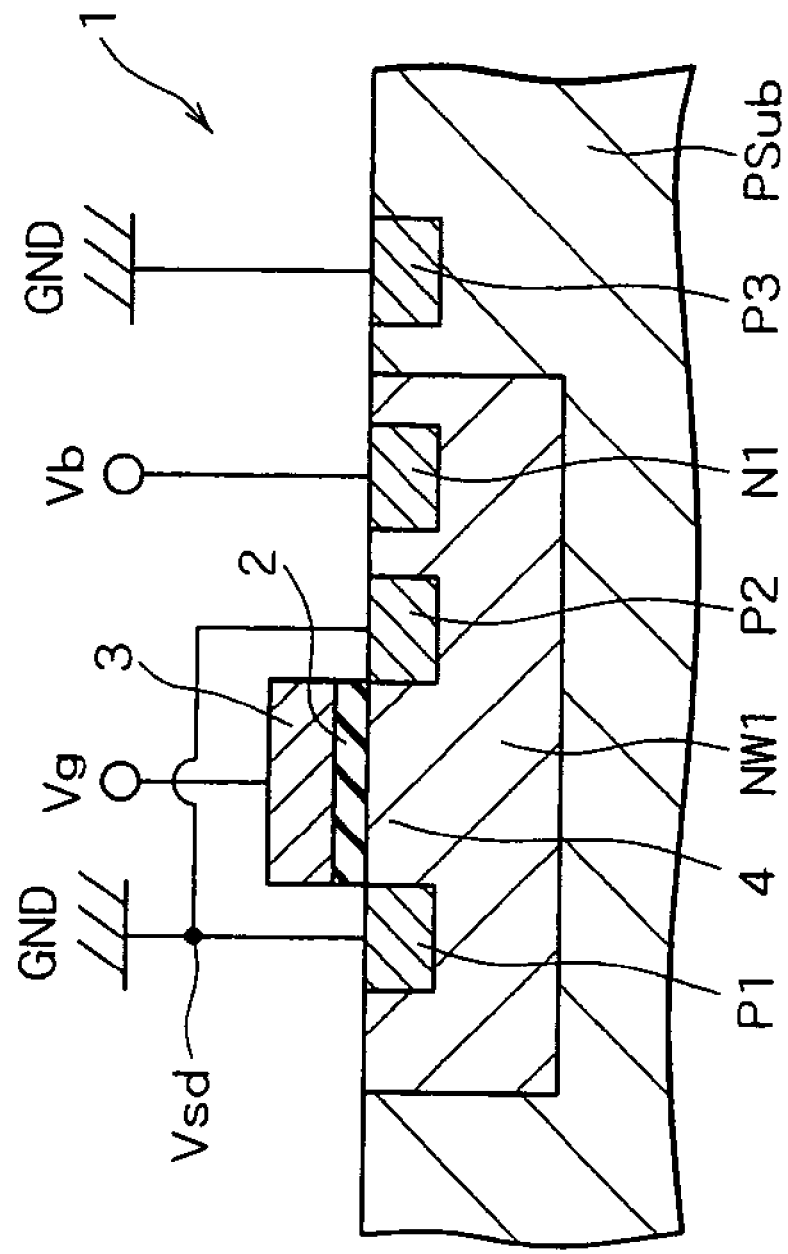
FIG. 4 is a cross-sectional view taken along the line A–A' in FIG. 3.
Figure 5:
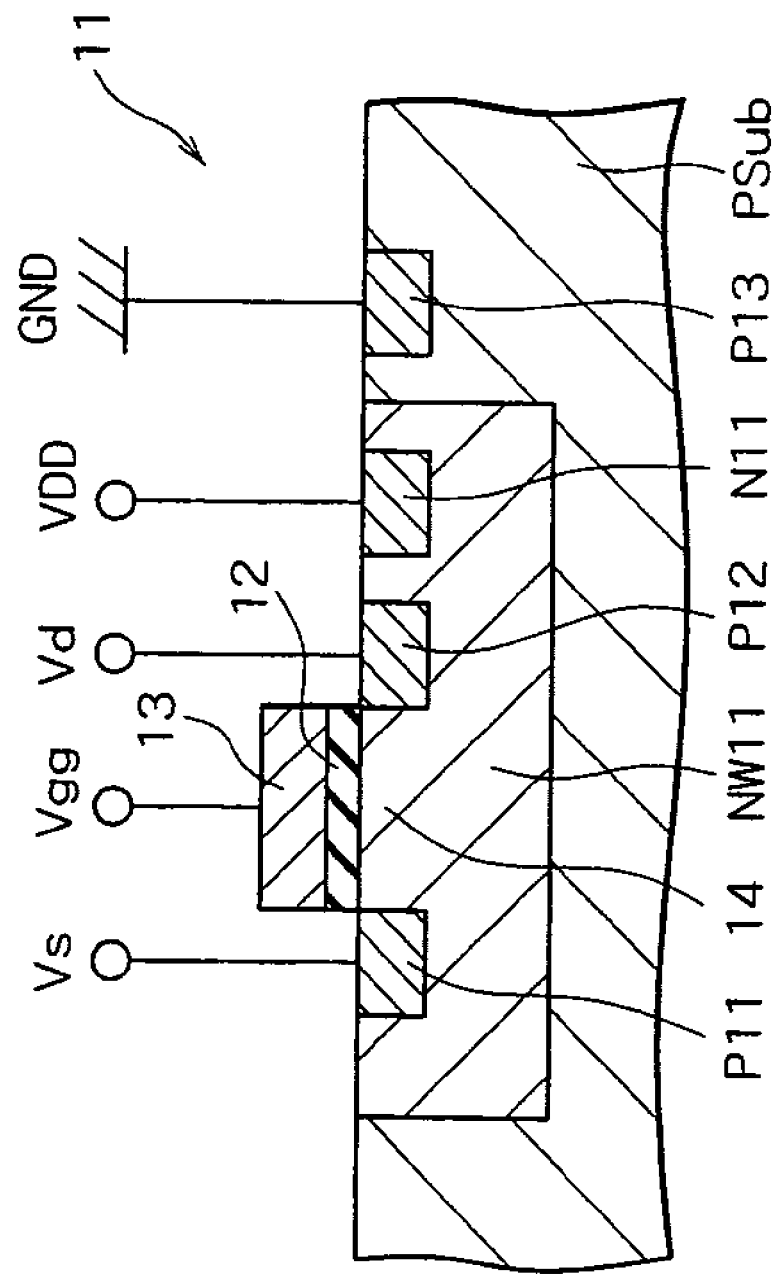
FIG. 5 is a cross-sectional view showing a P type MOS transistor provided in a semiconductor integrated circuit according to the embodiment.
Figure 6:
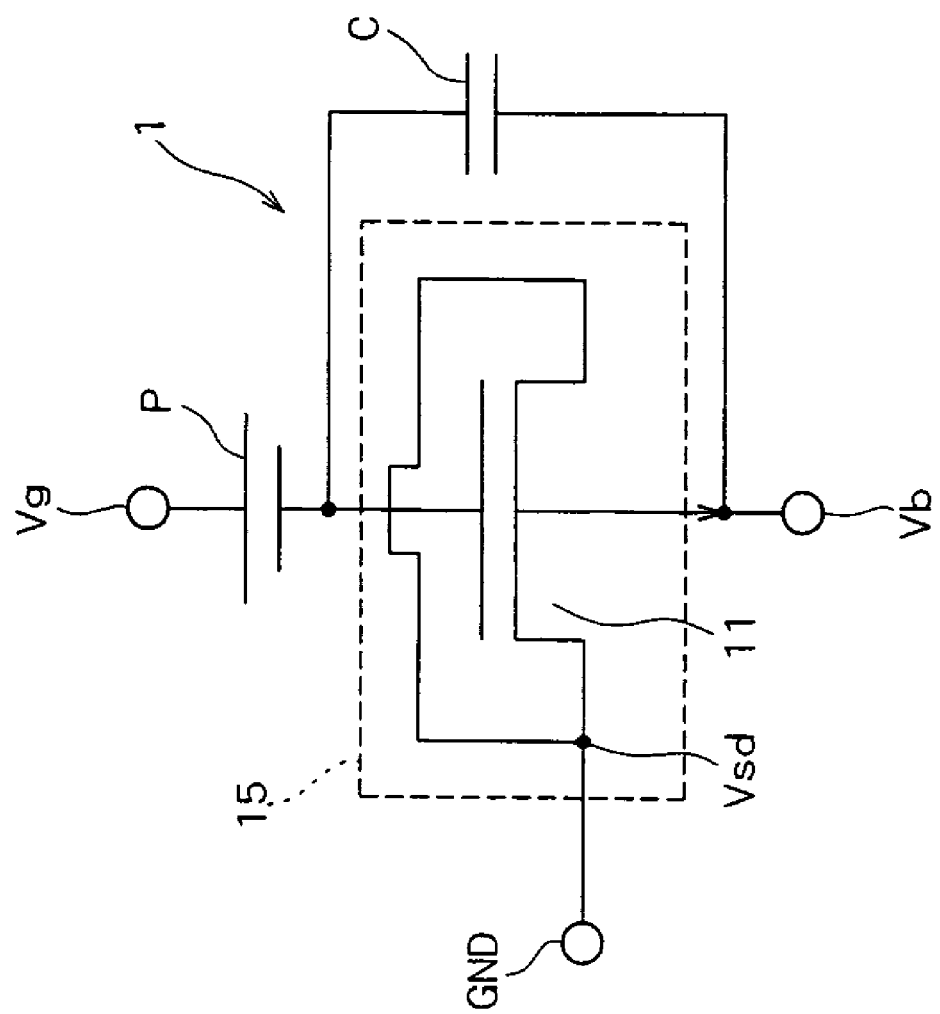
FIG. 6 is an equivalent circuit diagram of the varactor element of the embodiment.

Hereinafter, an embodiment of the present invention will be described with reference to the attached drawings. FIG. 3 is a plan view showing a varactor element according to the embodiment, FIG. 4 is a cross-sectional view taken along the line A–A' in FIG. 3, FIG. 5 is a cross-sectional view showing a P type MOS transistor provided in a semiconductor integrated circuit (IC) according to the embodiment, and FIG. 6 is an equivalent circuit diagram of the varactor element according to the embodiment.

The semiconductor IC according to the embodiment includes, for example, a voltage-controlled oscillator (VCO). The semiconductor IC includes a varactor element serving as a voltage-controlled capacitive element. As shown in FIGS. 3 and 4, a varactor element 1 of the embodiment includes a P type substrate Psub, which is formed of P type silicon for example, and an N well NW1 is disposed in part of the upper surface of the P type substrate PSub. Also, a gate insulating film 2 is disposed on the N well NW1 and a gate electrode 3, which is formed of poly silicon for example, is disposed on the gate insulating film 2. The gate electrode 3 is rectangular when viewed in the direction vertical to the upper surface of the P type substrate PSub. The gate insulating film 2 is not shown in FIG. 3.

Further, $p^+$ diffusion regions P1 and P2 are placed in two areas in the surface of the N well NW1 sandwiching the gate electrode 3 viewed in the direction vertical to the upper surface of the P type substrate PSub. In the region directly under the gate electrode 3 in the upper surface of the N well NW1, the region between the $p^+$ diffusion regions P1 and P2 serves as a channel region 4. Further, an $n^+$ diffusion region N1 is placed in the surface of the N well NW1 at an area separated from the channel region 4 and the $p^+$ diffusion regions P1 and P2. Also, a $p^+$ diffusion region P3 is placed in the upper surface of the P type substrate PSub at a part of an area where the N well NW1 is not disposed.

The channel region 4 is rectangular when viewed in the direction vertical to the upper surface of the P type substrate PSub. The length of the channel region 4 in a direction from the $p^+$ diffusion region P1 to the $p^+$ diffusion region P2 is defined as a gate length L. The length orthogonal to the gate length L is defined as a gate width W. The gate length L is shorter than the gate width W. For example, the gate length L is 10 µm and the gate width W is 20 µm.

The $P^+$ diffusion regions P1 and P2 are connected to an SD terminal Vsd, which is connected to a ground potential wiring GND. The gate electrode 3 is connected to a gate terminal Vg and the $n^+$ diffusion region Ni is connected to a well terminal Vb. The $P^+$ diffusion region P3 is connected to the ground potential wiring GND. In FIG. 4, the gate insulating film 2 is disposed only directly under the gate electrode 3. However, the gate insulating film 2 may be disposed over the entire upper surface of the P type substrate PSub except on an area which contacts, (not shown) is connected to, diffusion regions. In the varactor element 1, capacitance is generated between the gate electrode 3 and the N well NW1, that is, between the gate terminal Vg and the well terminal Vb.

As shown in FIG. 5, the semiconductor IC of the embodiment also includes a P type MOS transistor 11, which is disposed in the upper surface of the P type substrate PSub, as well as the above-described varactor element 1. In this P type MOS transistor 11 (hereinafter referred to as PMOS 11), an N well NW11 is disposed in the upper surface of the P type substrate PSub. Also, a gate insulating film 12 is disposed on the N well NW11, and a gate electrode 13 formed of poly silicon is disposed on the gate insulating film 12.

Also, $p^+$ diffusion regions P11 and P12 are placed in two areas in the surface of the N well NW11 sandwiching the gate electrode 13 viewed in the direction vertical to the upper surface of the P type substrate PSub. The $p^+$ diffusion region P11 is a source region and $p^+$ diffusion region P12 is a drain region. In a region directly under the gate electrode 13 in the surface of the N well NW11, the region between the $p^+$ diffusion regions P11 and P12 serves as a channel region 14. Further, an $n^+$ diffusion region N11 is placed in the surface of the N well NW11 at an area separated from the channel region 14 and the $p^+$ diffusion regions P11 and P12. Further, a $p^+$ diffusion region P13 is placed in a part of an area where the N well NW11 is not disposed in the upper surface of the P type substrate PSub.

The $p^+$ diffusion region P11 is connected to a source terminal Vs, the $p^+$ diffusion region P12 is connected to a drain terminal Vd, and the gate electrode 13 is connected to a gate terminal Vgg. The $n^+$ diffusion region N11 is connected to a power-supply potential wiring VDD, and the $p^+$ diffusion region P13 is connected to the ground potential wiring GND. In FIG. 5, the gate insulating film 12 is disposed only directly under the gate electrode 13. However, the gate insulating film 12 may be disposed over the entire upper surface of the P type substrate PSub except an area which contacts (not shown) connected to diffusion regions are disposed. As shown in FIGS. 4 and 5, the configuration of the part below the gate electrode 3 of the varactor element 1 is the same as that of the part below the gate electrode 13 of the PMOS 11. However, in the varactor element 1 and the PMOS 11, terminals to which each diffusion region is connected are different from each other.

In the semiconductor IC of the embodiment, the varactor element 1 and the PMOS 11 are fabricated in the same process. That is, the N well NW1 of the varactor element 1 is formed in the same process as that of forming the N well NW11 of the PMOS 11, the $p^+$ diffusion regions P1 to P3 of the varactor element 1 are formed in the same process as that of forming the $p^+$ diffusion regions P11 to P13 of the PMOS 11, and the $n^+$ diffusion region N1 of the varactor element 1 is formed in the same process as that of forming the $n^+$ diffusion region N11 of the PMOS 11. Also, the gate insulating film 2 of the varactor element 1 is formed in the same process as that of forming the gate insulating film 12 of the PMOS 11, and the gate electrode 3 of the varactor element 1 is formed in the same process as that of forming the gate electrode 13 of the PMOS 11. The gate insulating films 2 and 12 may be a continuous single layer.

The varactor element 1 of the embodiment can be illustrated by the equivalent circuit shown in FIG. 6. As shown in FIG. 6, in the equivalent circuit, the PMOS 11 is provided. The source and drain of the PMOS 11 are connected to the SD terminal Vsd, which is connected to the ground potential wiring GND. The gate of the PMOS 11 is connected to the gate terminal Vg through a power supply P, and the substrate is connected to the well terminal Vb. Further, a fixed capacitance C is provided between the gate of the PMOS 11 and the substrate. The power supply P and the fixed capacitance C are used for fittings when the operation of the varactor element 1 is simulated by using this equivalent circuit, and do not correspond to the elements of the varactor element 1 shown in FIGS. 3 and 4. The part enclosed by a broken line 15 in the equivalent circuit shown in FIG. 6 can be formed by using the parameters of the existing P type MOS transistor.

Next, the operation of the varactor element 1 having the above-described configuration will be described. As shown in FIGS. 3 and 4, by applying a ground potential to the $p^+$ diffusion region P3 through the ground potential wiring GND, the P type substrate PSub is set at a ground potential. Also, a ground potential is applied to the $p^+$ diffusion regions P1 and P2 through the ground potential wiring GND and the SD terminal Vsd. Preferably, the potential applied to the $p^+$ diffusion regions P1 and P2 is the lowest among potentials, which are available in the semiconductor IC of the embodiment. This potential is not limited to the ground potential, but it must be set so that a forward pn junction is not generated between the N well NW1 and the $p^+$ diffusion regions P1 and P2.

By changing the voltage between terminals Vgb applied between the gate terminal Vg and the well terminal Vb, the capacitance between the gate electrode 3 and the N well NW1 is changed. For example, the potential of the well terminal Vb may be set at the potential (VDD/2), which is the middle of the ground potential GND and the power-supply potential VDD, and the potential of the gate terminal Vg may be changed between the ground potential GND and the power-supply potential VDD. Accordingly, the voltage between terminals Vgb changes in the range of (−VDD/2) to (+Vdd/2).

Figure 7:
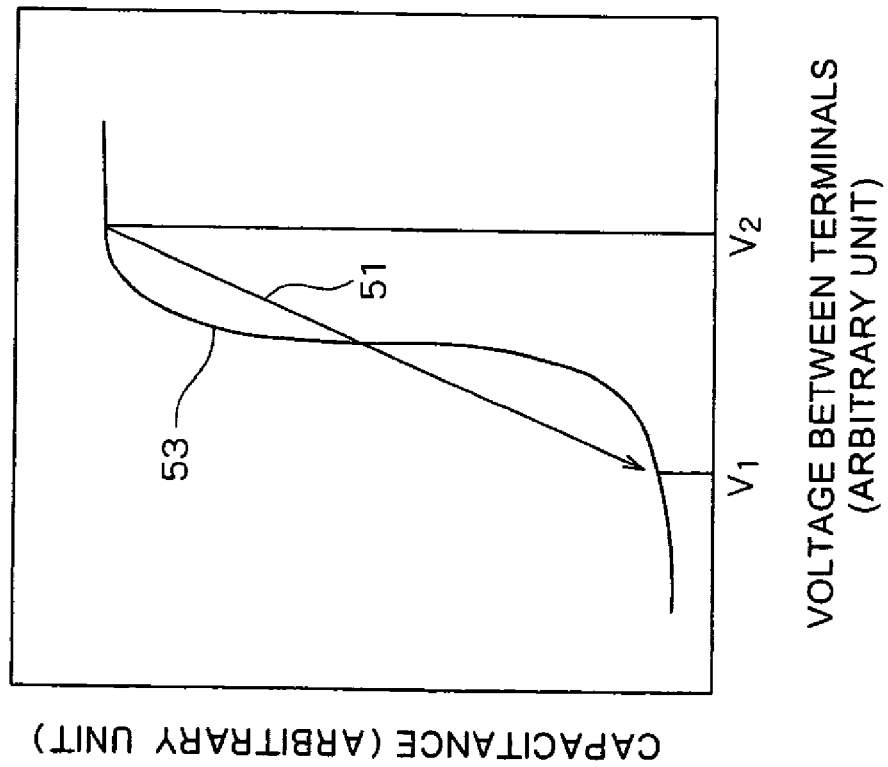
FIG. 7 is a graph showing the voltage dependence of the capacitance in the varactor element of the embodiment, in which the horizontal axis indicates a voltage between terminals and the vertical axis indicates capacitance between a gate terminal and a well terminal.

FIG. 7 is a graph showing the voltage dependence of the capacitance of the varactor element 1, in which the horizontal axis indicates the voltage between terminals (Vgb) and the vertical axis indicates the capacitance between the gate terminal Vg and the well terminal Vb. As shown in FIGS. 4 and 7, by setting the voltage between terminals Vgb at an adequately high value $V_2$, electrons are accumulated in the channel region 4 of the N well NW1, so that the varactor element 1 is brought into an accumulation state. As a result, the capacitance of the varactor element 1 reaches a maximum, which is substantially equal to the capacitance of the gate insulating film 2. By decreasing the voltage between terminals Vgb from this state, a depletion layer is generated in the channel region 4. Due to the expansion of the depletion layer, the varactor element 1 is brought into a depletion state, so that the capacitance of the varactor element 1 decreases. Then, when the voltage between terminals Vgb reaches an adequately low value $V_1$, expansion of the depletion layer becomes saturated. Accordingly, the capacitance reaches a minimum and does not decrease any more.

In this case, by changing the voltage between terminals from $V_2$ to $V_1$, electrons accumulated in the channel region 4 are absorbed by the well terminal Vb through the $n^+$ diffusion region N1, so that a depletion layer is formed in the channel region 4. Accordingly, the capacitance decreases along a solid line 53 as indicated by an arrow 51 in FIG. 7. At this time, in the channel region 4, positive holes are thermally generated or are flown therein from the P type substrate PSub. However, the $p^+$ diffusion regions P1 and P2 serve as a drain and absorb these positive holes, and thus an inversion layer is not formed in the channel region 4. Therefore, the increase in the capacitance as indicated by the arrow 52 in FIG. 2 does not occur. As a result, in the varactor element 1, the solid line 53 shown in FIG. 7 (not the broken line 54 shown in FIG. 2) is brought into a thermal equilibrium state. Accordingly, when the voltage between terminals is changed from $V_2$ to $V_1$, the channel region 4 instantly reaches a thermal equilibrium state. Incidentally, the operation of the PMOS 11 is the same as that of an ordinary P type MOS transistor.

In the embodiment, when the voltage between terminals is changed from $V_2$ to $V_1$, positive holes in the channel region 4 are absorbed by the ground potential wiring GND through the $p^+$ diffusion regions P1 and P2. Therefore, an inversion layer is not formed in the channel region 4, and thus the capacitance does not increase gradually. As a result, when the voltage between terminals is instantly changed, the capacitance quickly changes accordingly so as to reach a thermal equilibrium state. That is, change in the capacitance quickly follows change in the voltage between terminals. Therefore, in a VCO including this varactor element, an oscillation frequency quickly changes in response to a control voltage. Incidentally, when the voltage between terminals is changed from $V_1$ to $V_2$, change in the capacitance follows in the same way as in the conventional varactor element.

In the embodiment, the configuration of the part below the gate electrode 3 of the varactor element 1 is the same as that of the part below the gate electrode 13 of the PMOS 11. Therefore, as shown in FIG. 6, the equivalent circuit used for simulating the operation of the varactor element 1 can be easily formed by using the transistor parameters of the existing PMOS.

Further, the gate length L of the channel region 4 is shorter than the gate width W when viewed in the direction vertical to the upper surface of the P type substrate PSub. With this configuration, an average distance between each point in the channel region 4 and the $p^+$ diffusion regions P1 and P2 is short, so that the $p^+$ diffusion regions P1 and P2 can efficiently absorb positive holes.

Since the varactor element 1 is fabricated in the same process as that for the PMOS 11, the varactor element 1 can be easily fabricated. Further, a special step of forming the varactor element 1 need not be added to a process of fabricating the semiconductor IC. Therefore, the cost for fabricating the semiconductor IC does not increase even if the varactor element 1 is fabricated.

In the embodiment, the $p^+$ diffusion regions P1 and P2 are provided so that they sandwich the channel region 4. However, the present invention is not limited to this configuration, but the number of $p^+$ diffusion regions for absorbing positive holes may be only one or three or more. Alternatively, a ring-shaped $p^+$ diffusion region may be provided so as to encircle the channel region 4.

In the embodiment, the N well is disposed in the upper surface of the P type substrate and the $p^+$ diffusion regions for absorbing positive holes are disposed in the upper surface of the N well. However, in the varactor element of the present invention, the conductive type may be inverted. That is, a P well may be disposed in the upper surface of an N type substrate, and $n^+$ diffusion regions for absorbing electrons may be disposed in the surface of the P well.

What is claimed is:

1. A semiconductor device comprising a voltage-controlled capacitive element having a variable capacitance characteristic responsive to a variable control voltage, said voltage-controlled capacitive element comprising:
   a first semiconductor region of a first conductivity type;
   second and third semiconductor regions selectively formed in said first semiconductor region apart from each other with an intervention of a part of said first semiconductor region therebetween, each of said second and third semiconductor regions being a second conductivity type, wherein each of said second and third regions has a side facing each other and said side is larger in length than a distance between said second and third regions,
   an insulating film formed on said part of said first semiconductor region;
   a conductive film formed on said insulating film;
   a first wiring line formed to supply a bias voltage in common to said second and third semiconductor regions, said bias voltage being different from said variable control voltage; and
   second and third wiring lines supplied with said variable control voltage therebetween and formed to be connected respectively to a region within said first semiconductor region and to said conductive film.

2. The device as claimed in claim 1, wherein said bias voltage is a ground voltage.

3. The device as claimed in claim 1, wherein said voltage-controlled capacitive element further comprises a semiconductor substrate of said second conductivity type,
said first semiconductor region being selectively formed in said semiconductor substrate, and said bias voltage being supplied in common to said second and third semiconductor regions and said semiconductor substrate.

4. The device as claimed in claim 2, wherein said first conductivity type is an N-type and said second conductivity type is a P-type, said bias voltage being a ground voltage.

5. A semiconductor device having a varactor, said varactor comprising:
a semiconductor substrate of a first conductivity type;
a first region of a second conductivity type selectively formed in said semiconductor substrate;
a second region of said first conductivity type selectively formed in said first region;
a third region of said first conductivity type selectively formed in said first region apart from said second region;
wherein each of said second and third regions has a side facing each other and said side is larger in length than a distance between said second and third regions,
a second wiring formed in contact with each of said second and third regions;
an insulating film formed on a portion of said first region sandwiched between said second and third regions;
a conductive film formed on said insulating film; and
means for supplying a substantially constant voltage to said wiring and a variable voltage between said first region and said conductive film so that said varactor represents a variable capacitance in response to said variable voltage.

6. The device as claimed in claim 5, wherein said device further including a transistor, said transistor comprising a fourth region of said second conductivity type selectively formed in said semiconductor substrate apart from said first region, source and drain regions of said first conductivity type selectively formed in said fourth region apart from each other to define a channel region, a gate insulating film covering said channel region, and a gate electrode formed on said gate insulating film.

7. The device as claimed in claim 6, further including means for supplying said substrate with a voltage that is substantially equal to said substantially constant voltage.

* * * * *